United States Patent

Nakamura

[11] Patent Number: 5,936,563
[45] Date of Patent: Aug. 10, 1999

[54] DIGITAL-TO-ANALOG CONVERSION CIRCUIT

[75] Inventor: Yasuyuki Nakamura, Tokyo, Japan

[73] Assignee: Mitsubishi Denki Kabushiki Kaisha, Tokyo, Japan

[21] Appl. No.: 08/887,081

[22] Filed: Jul. 2, 1997

[30] Foreign Application Priority Data

Mar. 11, 1997 [JP] Japan ................................ 9-056219

[51] Int. Cl.$^6$ ............................................. H03M 1/66
[52] U.S. Cl. ............................................................ 341/144
[58] Field of Search .................................... 341/144, 136, 341/154, 118

[56] References Cited

U.S. PATENT DOCUMENTS 5,218,364 6/1993 Kumazawa et al. ..................... 341/136

FOREIGN PATENT DOCUMENTS 340524 2/1991 Japan .

*Primary Examiner*—Brian Young
*Attorney, Agent, or Firm*—Leydig, Voit & Mayer, Ltd.

[57] ABSTRACT

A current output digital-to-analog conversion circuit for converting a digital signal to an analog signal by supplying a current through an output resistor includes a variable resistance circuit for varying an output resistance in response to an external control signal and a current supplying portion for adjusting a current in response to a gate voltage. The resistance of the resistor in the variable resistance circuit is changed by an external control signal, the current of the current supplying portion is changed by changing the gate voltage, whereby the output current can be changed while keeping an output voltage amplitude constant, and the output voltage amplitude can be changed while keeping the output current constant.

14 Claims, 8 Drawing Sheets

| Bit2 | Bit1 | Bit0 | DECIMAL SYSTEM | |
|---|---|---|---|---|
| 0 | 0 | 0 | 0 | ← ALL SWITCHES OFF |
| 0 | 0 | 1 | 1 | ← ONLY SW1 ON |
| 0 | 1 | 0 | 2 | ← ONLY SW1, 2 ON |
| 0 | 1 | 1 | 3 | ← ONLY SW1, 2, 3 ON |
| 1 | 0 | 0 | 4 | ← ONLY SW1, 2, 3, 4 ON |
| 1 | 0 | 1 | 5 | ← ONLY SW1, 2, 3, 4, 5 ON |
| 1 | 1 | 0 | 6 | ← ONLY SW1, 2, 3, 4, 5, 6 ON |
| 1 | 1 | 1 | 7 | ← ALL SWITCHES ON |

FIG.3

DIGITAL-TO-ANALOG CONVERSION CIRCUIT

BACKGROUND OF THE INVENTION

1. Field of the Invention

The invention relates to a current output digital-to-analog conversion circuit. The invention particularly relates to a digital-to-analog conversion circuit that can speed up the transition rate of the output voltage while keeping the output voltage constant.

2. Description of the Prior Art

FIG. 6 shows a conventional current output digital-to-analog conversion circuit. The conventional current output digital-to-analog conversion circuit comprises a digital-to-analog conversion circuit 1 on the chip of a semiconductor integrated circuit, a current supplying portion 2 that changes a current value according to digital data applied to switch 8 (8-1, 8-2, . . . 8-m, m is a positive integer), a current source 3 (3-1, 3-2, . . . 3-m) producing a current value controlled by a bias voltage applied to a bias voltage input terminal (VG) 4, an analog output terminal 5 where the analog voltage Vout is output from the digital-to-analog conversion circuit 1, a current input terminal 6 of the current supplying portion 2 where a current flows via a resistor 9, a voltage source 7, an output resistor 9 through which current flows through the current source according to the on/off state of a switch 8, and a ground 15.

The operation of the conventional digital-to-analog conversion circuit of FIG. 6 is as explained below. Input digital data turns on or off corresponding switch 8 (8-1, 8-2, . . . 8-m). The current source 3 (3-1, 3-2, . . . 3-m) connected to the voltage supply 7 via the switches 8, supplies the current through the output resistor 9. The voltage drop of the output resistor 9 is supplied to the analog output terminal 5 as an analog voltage. When many of the current sources 3 are connected to the voltage source Vdd by many of the switches 8, a large current flows through the output resistor 9. The voltage drop of the output resistor 9 becomes large and the voltage at the analog output terminal 5 falls.

On the other hand, when only a few of the current sources 3 are connected to the voltage source Vdd by a few of the switches 8, a small current flows through the output resistor 9. The voltage drop of the output resistor 9 becomes small and the voltage at the analog output terminal 5 rises. In this way, in the digital-to-analog conversion circuit 1, the number of current sources 3 selected by the switches 8 according to the value of the digital data input, whereby an analog voltage corresponding to the digital data is obtained at the analog output terminal 5.

Up to the present, since a digital-to-analog converter has been constructed in such a manner, when the transition rate of the output of the digital-to-analog conversion circuit is not sufficient, in other words, when the response rate for a voltage change is slow, the bias voltage of the current source transistor is usually changed to obtain a larger full scale current. In this case, however, as shown in FIG. 8, although the transition rate of the output of the digital-to-analog conversion circuit becomes faster, such as moving from curve "a" to curve "e", when the bias voltage is set higher such as from VG1 to VG5, the output voltage has fallen such as from V1 to V5. This result occurs because, although the output current becomes large, the output resistance is not changed.

This phenomenon is explained in more detail below. FIG. 7 shows a general transistor characteristic (voltage between drain sources versus drain current) of the CMOS transistor. FIG. 8 shows the relation between the output voltage Vout versus the output transition time when the bias voltage (gate voltage) of a CMOS transistor is increased from V1 to V5 such as VG1<VG2<VG3<VG4<VG5. As shown in FIG. 7, when the gate voltage VG of the transistor is increased such as VG1<VG2<VG3<VG4 <VG5, the drain current flowing through the drain of the MOS transistor also increases according to the increase of the gate voltage. As understood from FIG. 8, since the current which flows through the output resistor 9 increases when the bias voltage of the transistor of the current source 3 becomes higher, the output transition time becomes shorter. But the output voltage Vout falls since the voltage drop of the output resistor 9 becomes larger. For example, when the gate voltage changes from zero to VG1, the output voltage Vout transfers from VDD to the voltage V1 on the straight line p with the transition slope "a". In the same way, for VG2, the output voltage Vout changes from VDD to the voltage V2 on the straight line q with the transition slope "b". For VG3, from VDD to V3 on the straight line r with the transition slope "c", for VG4, from VDD to V4 on the straight line s with the transition slope "d", and for VG5, from VDD to V51 on the straight line t with the transition slope "e".

Usually the output voltage amplitude (power supply voltage VDD-output voltage) is prescribed by a system or an application, and therefore, it can not be changed. Accordingly, if the transition rate of the digital-to-analog conversion circuit must be made faster by increasing the output current, it is necessary to make the resistance of the resistor small so that the output voltage amplitude does not change. But if the digital-to-analog conversion circuit is produced in a mass production process, significant labor is necessary to change the resistance of a large number of resistors. There has been a problem that it is necessary to redesign the chip since it is not realistic to change such a large number of resistors.

Further, if the same chip is used for a different output voltage which is prescribed for every system and application, it is necessary to increase (or decrease) the resistances of the external resistors or to increase (or decrease) the output current for every digital-to-analog conversion circuit. When the output current increases, it is not necessary to change the resistance of the external resistor. However, there is a problem because the power consumption of the chip increases.

SUMMARY OF THE INVENTION

It is an object of the present invention to provide a digital-to-analog conversion circuit that can keep the output voltage amplitude constant even if the output current is increased in order to make the transition rate faster.

It is another object of the present invention to provide a digital-to-analog conversion circuit applicable to different output voltage amplitudes by adjusting the current of each chip if many of the same chips are used in the system.

According to one aspect of the invention, a current output digital-to-analog conversion circuit for converting a digital signal to an analog signal by supplying a current through an output resistor, the circuit comprises a variable resistance circuit for varying an output resistance in response to an external control signal; and a current supplying portion for adjusting a current in response to a gate voltage control signal wherein an output current can be changed while keeping an output voltage amplitude constant, and the output voltage amplitude can be changed while keeping the output current constant.

According to another aspect of the invention, the current supplying portion of the digital-to-analog conversion circuit comprises a plurality of MOS transistors connected in parallel and having gate voltages controlled by a gate voltage control signal; a plurality of switches each switch having a first end connected to one terminal of a corresponding MOS transistor and a second end connected to the output terminal; and a decoding circuit for decoding an input digital data for controlling on/off states of corresponding switches wherein a switch is turned on or off in response to a signal decoded by the decoding circuit according to input digital data so that a corresponding number of current sources are connected in parallel, and current flowing is controlled by the gate voltages of the MOS transistors.

According to a further aspect of the invention, the variable resistance circuit of the digital-to-analog conversion circuit comprises a plurality of series circuits of resistors and switches controlled by a BUS control signal.

According to a still further aspect of the invention, the variable resistance circuit digital-to-analog conversion circuit further comprises a serial-parallel conversion circuit for converting the parallel BUS control signal into a serial signal; and a decoding circuit for decoding an output signal from the serial-parallel conversion circuit wherein the switches include MOS transistors having gates controlled by a signal decoded by the decoding circuit for connecting corresponding resistors in parallel.

BRIEF DESCRIPTION OF THE DRAWINGS

FIG. 3 shows combinations of current sources according to the input digital data.

DETAILED DESCRIPTION OF PREFERRED EMBODIMENTS

Embodiment 1

Figure 1:
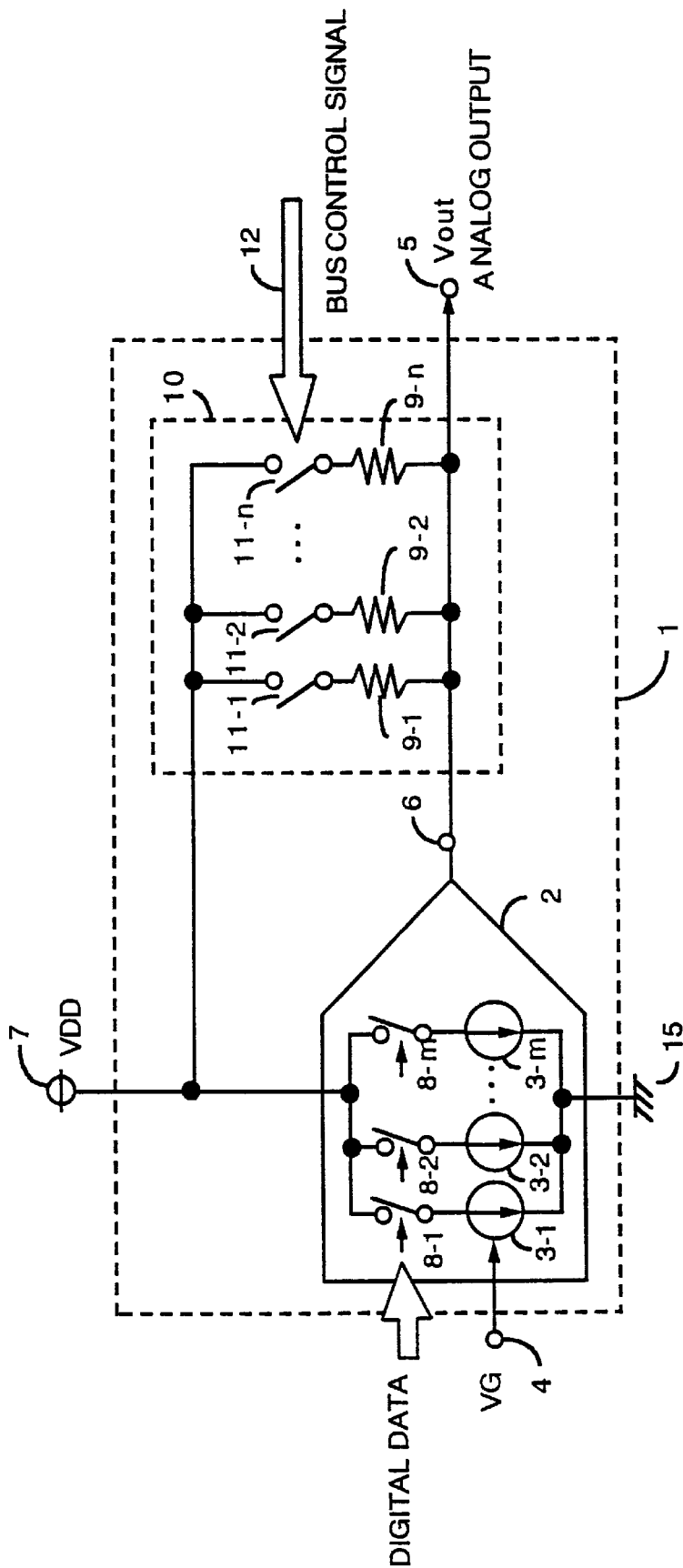
FIG. 1 shows a digital-to-analog conversion circuit of a first embodiment of the present invention.

A first embodiment of the present invention is explained below. FIG. 1 shows a digital-to-analog conversion circuit of the first embodiment of the present invention. The digital-to-analog conversion circuit of FIG. 1 comprises a digital-to-analog conversion circuit 1 on the chip of a semiconductor integrated circuit, a current supplying portion 2 for changing a current value according to digital data input to switch 8 (8-1, 8-2, . . . 8-m), current source 3 (3-1, 3-2, . . . 3-m) having a current value controlled by the bias voltage input at a bias voltage input terminal 4, an analog output terminal 5 of the digital-to-analog conversion circuit where the analog voltage Vout is output from the digital-to-analog conversion circuit 1, a current input terminal 6 of the current supplying portion 2 where a current flows via a resistor 9 (9-1, 9-2, . . . 9-n (n is a positive integer)), a voltage source 7, switch 8 (8-1, 8-2, . . . 8-m) for switching on and off the current source 3 based on the input digital data, an output resistor 9 (9-1, 9-2, . . . 9-n (n is a positive integer)) through which the current flows through the current source according to on/off state of the switches 8, switch 11 (11-1, 11-2, . . . 11-n) for switching the connection of the output resistors 9 to the voltage supply VDD according to the BUS control signal 12 supplied from outside, such as from personal computers, a variable resistance circuit 10, and a ground 15.

In the digital-to-analog conversion circuit of FIG. 1, the digital data and the bias voltage are supplied to the current supplying portion 2, and the output terminal (or the current input terminal) 6 of the current supplying portion 2 is connected to the voltage source 7 via the output resistors 9 (9-1, 9-2, . . . 9-n) and 11 (11-1, 11-2, . . . 11-n). The switch 8 (8-1, 8-2, . . . 8-m) are turned on or off in response to the digital data. The bias voltage input terminal 4 is connected to the respective gate of MOS transistors constituting the current source 3. The current from the current sources 3 is changed by the bias voltage supplied to the bias voltage input terminal 4. The BUS control voltage 12 supplied from a personal computer operates the switch 11 (11-1, 11-2, . . . , 11-n). In this digital-to-analog conversion circuit 1, the input digital data is converted into the analog voltage Vout. The signals supplied from outside to the digital-to-analog conversion circuit are the BUS control voltage 12, the digital data, and the bias voltage VG.

Next, the operation of the digital-to-analog conversion circuit of the first embodiment is explained. In FIG. 1, the digital data is input to the switch 8 (8-1, 8-2, . . . 8-m) and the switch 8 (8-1, 8-2, . . . 8-m) corresponding to the digital data are actuated. The current flows from the voltage source 7 to the current sources 3 actuated by the switch 8 (8-1, 8-2, . . . 8-m) through the output resistors 9 (9-1, 9-2, . . . 9-n) selected according to the BUS control signal. The quantity of the current flowing is determined by the bias voltage VG supplied to the bias voltage input terminal 4 as mentioned later. It is necessary to increase the current supplied from the analog output terminal 5 in order to increase the transition rate of the output signal at the analog output terminal 5. In the present invention, the switches 11 in the variable resistance circuit 10 are controlled according to the BUS control signal 12 and, at the same time, the switches 8 in the current supply portion 2 are controlled by the bias voltage VG. Thereby, the analog voltage at the analog output terminal 5 can be kept constant regardless of the current output from the analog output terminal 5.

Figure 5:
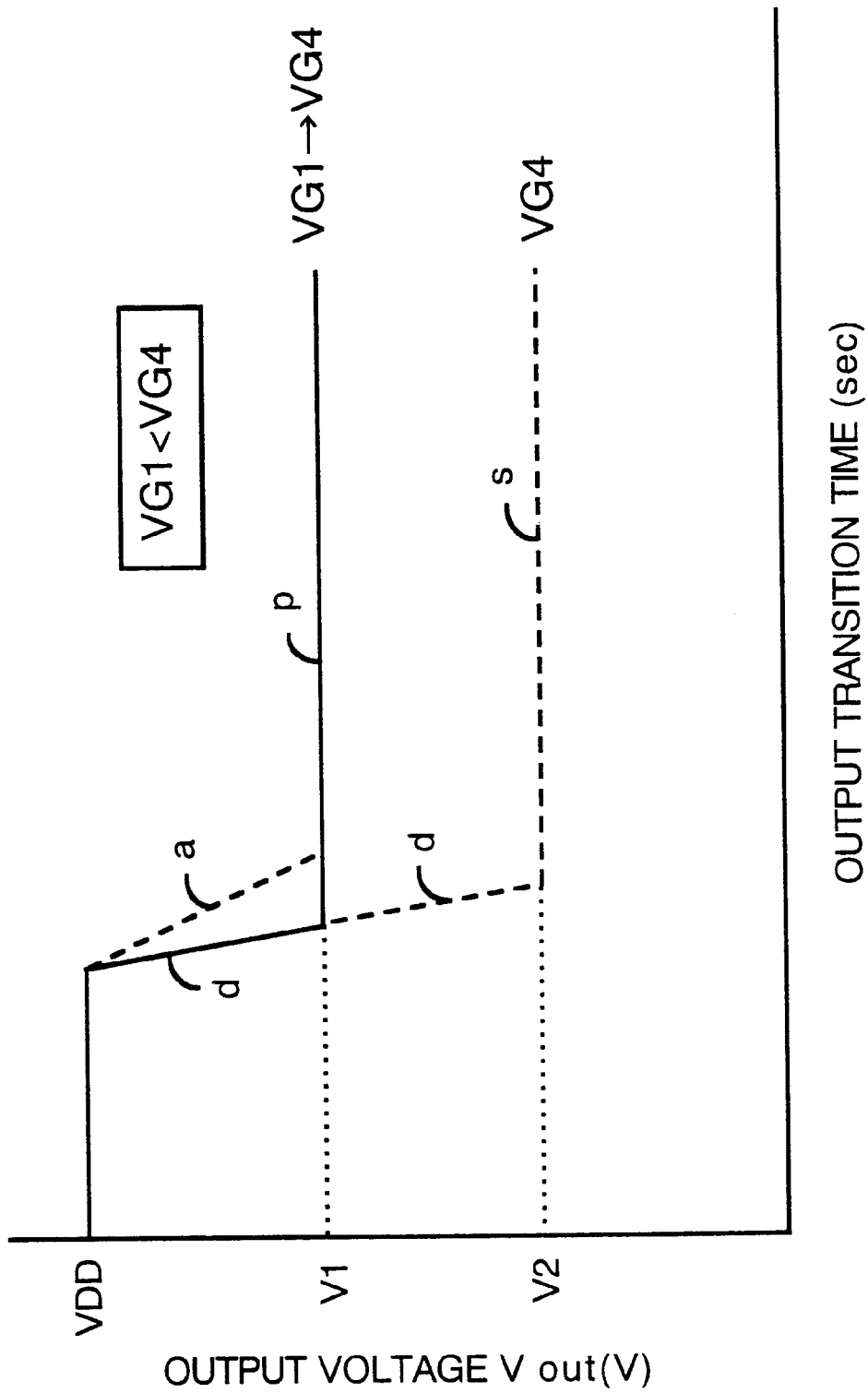
FIG. 5 shows a relationship between output transition time and output voltage Vout of the first embodiment of the present invention.
Figure 6:
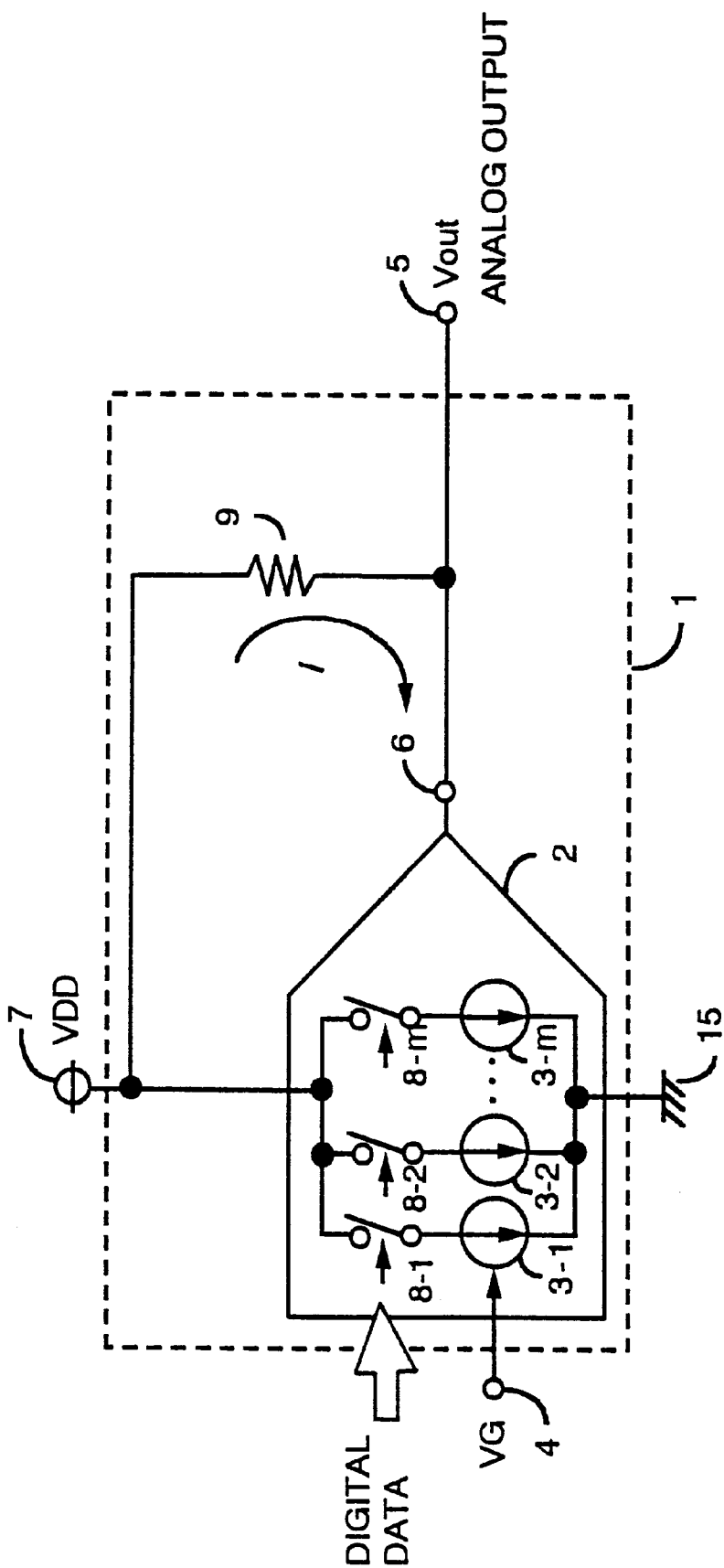
FIG. 6 shows a conventional digital-to-analog conversion circuit.
Figure 7:
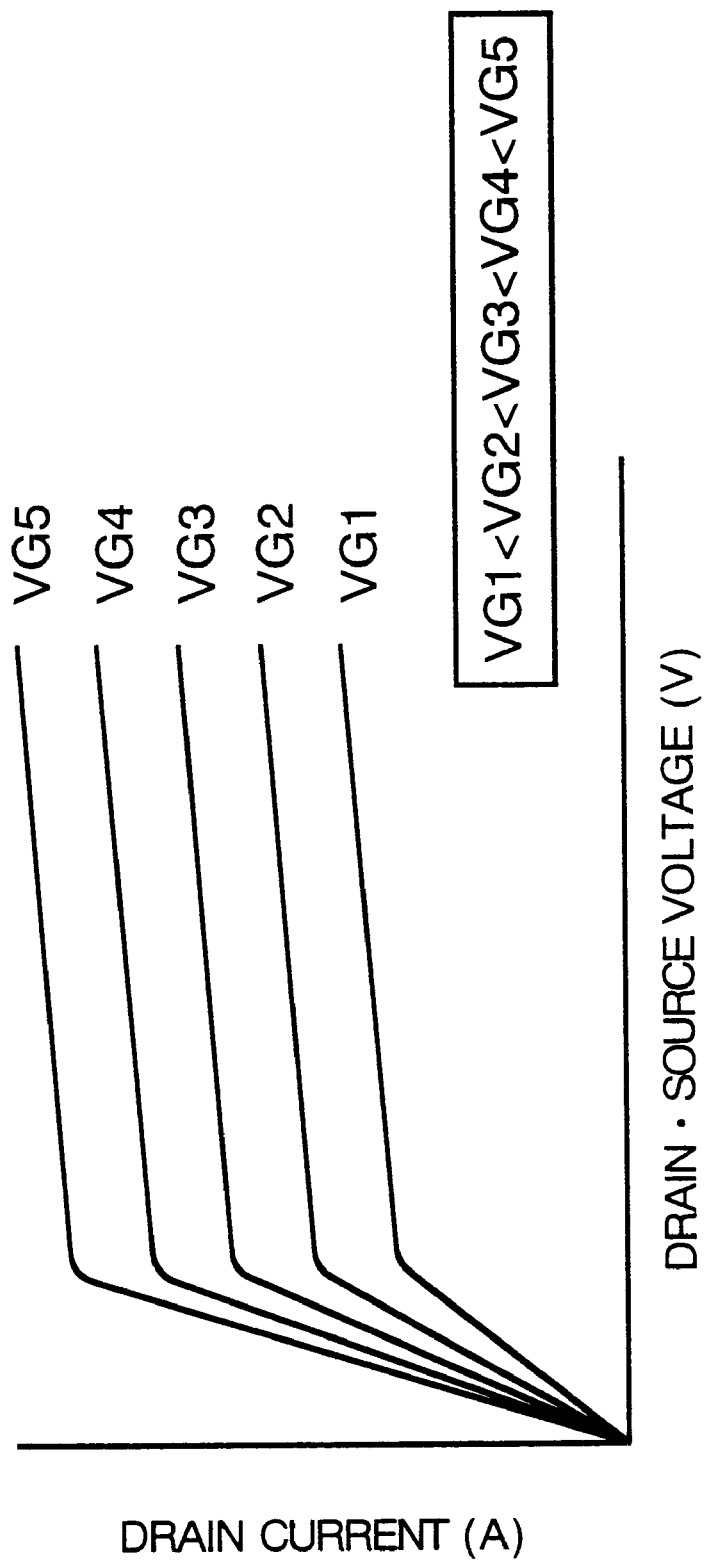
FIG. 7 shows a characteristic of a MOS transistor.
Figure 8:
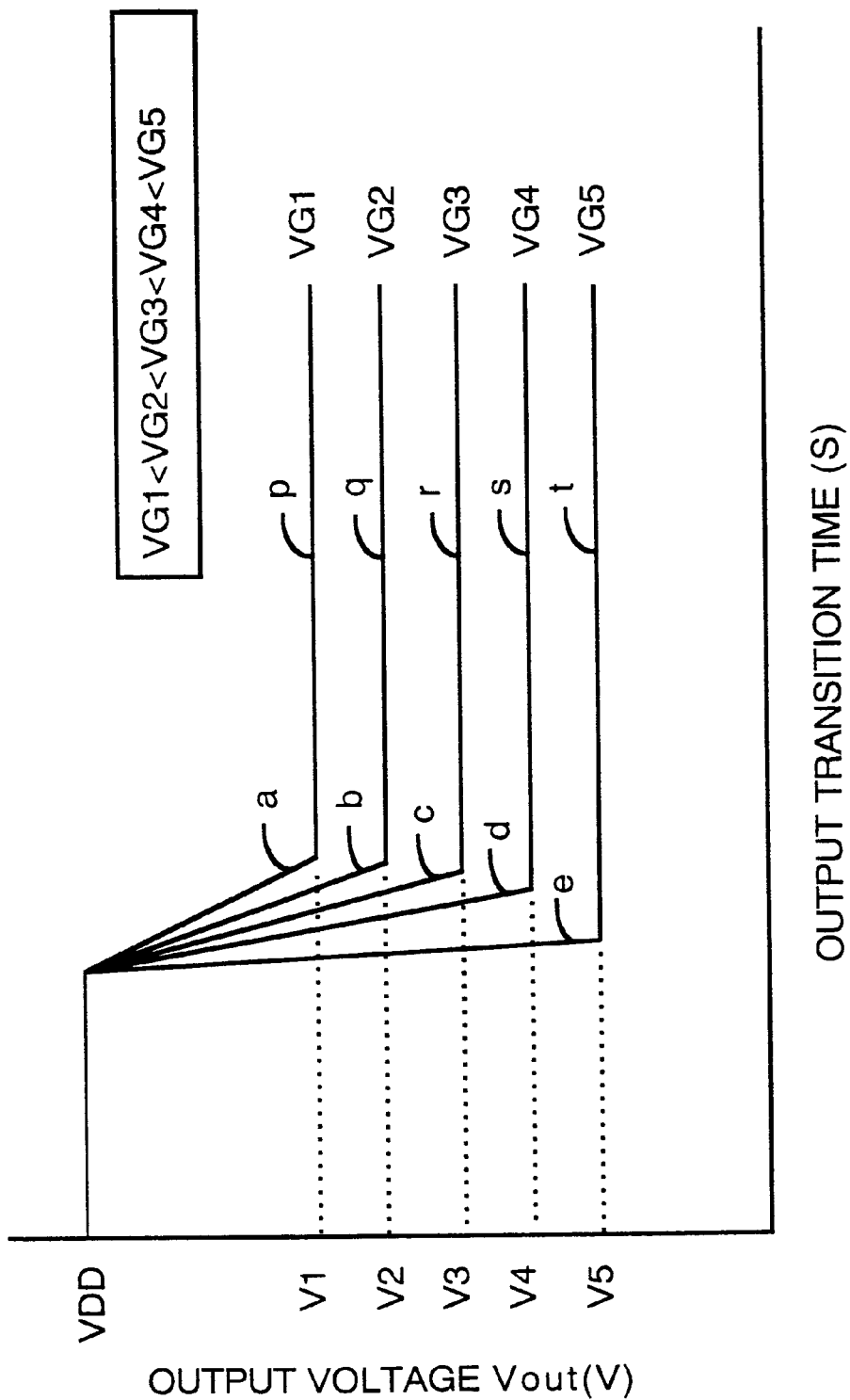
FIG. 8 shows a relationship of an output voltage versus an output transition time when the bias voltage VG applied to a current source is changed.

FIG. 5 shows the relationship between the output voltage Vout versus the output transition time, when the bias voltage VG supplied to the current source increases, for example, from VG1 to VG4. As shown in FIG. 5, when the gate voltage VG of the transistor of the current source 3 increases from the current gate voltage V1 to another gate voltage V4, the current flowing through the output resistor 9 increases.

On the other hand, if the resistance of the output resistor 9 is reduced by selecting the resistance of the resistors 9, the output voltage Vout at the analog output terminal 5 can be maintained at V1. That is, although the current flowing through the output resistor 9 is large, the voltage drop at the output resistor 9 can be maintained constant since the resistance of the output resistors 9 is controlled by the BUS control signal.

In this way, by changing the bias voltage VG applied to the gate of the MOS transistor of the current source 3 and, at the same time, changing the resistances of the output resistors 9 to satisfy a desired relation, the current can be increased while keeping the output voltage at the analog output terminal 5 at V1. This is further explained in detail using FIG. 5. In FIG. 5, the transition curve a-p shows a state when the gate voltage is VG1 and the output voltage at the analog output terminal 5 is V1. The transition curve d-s shows a state when the gate voltage is VG4 and the output voltage at the analog output terminal 5 is V2. The transition curve d-s shows a conventional state where the output resistors 9 are not changed. In the present invention, since the resistors 9 and the currents of the current sources 3 are controlled at the same time, a transition curve d-p can be obtained. It is appreciated from the transition curve d-p that the transition slope is shown as "d" which indicates a very fast transition rate and also the output voltage is V1 which is not reduced regardless of an increase in the current output from the analog output terminal 5.

As stated above, even if faster transition rate of the digital-to-analog conversion circuit is required after the digital-to-analog conversion circuit is incorporated into a system, it is possible to increase the output current and increase the transition rate while keeping the output voltage amplitude constant. Therefore, it is not necessary to change the system board or the design of the chip. Also it is possible to set the output voltage amplitude arbitrarily while maintaining the output voltage amplitude constant.

Embodiment 2

Figure 2:
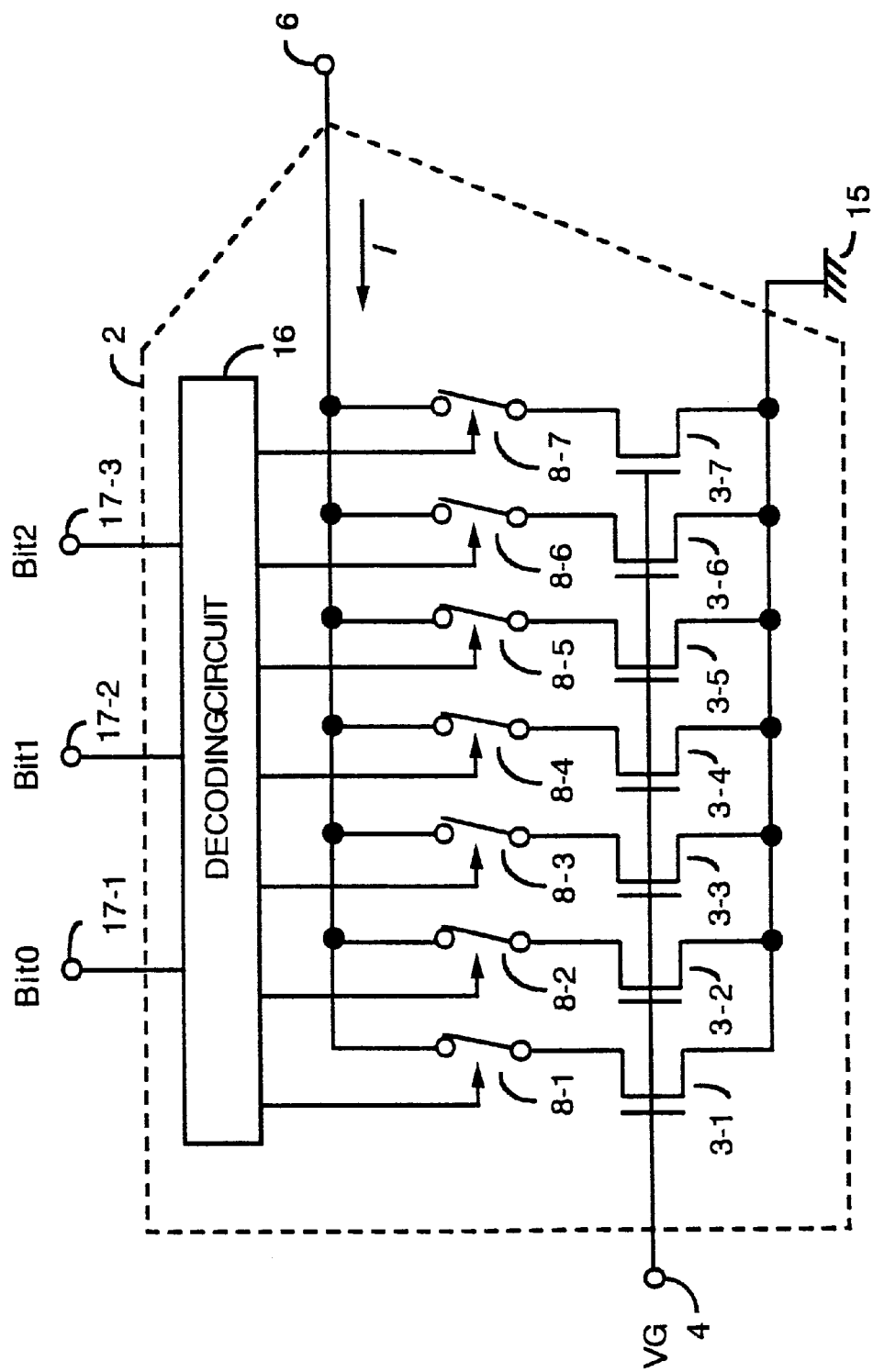
FIG. 2 shows a current supplying portion of a second embodiment of the present invention.

FIG. 2 shows the construction of a current supplying portion 2 in a second embodiment of the present invention. The current supplying portion 2 of FIG. 2 comprises digital data input terminals 17 (17-1, 17-2, 17-3) for receiving the digital data for switching the current source 3 (3-1, 3-2, . . . 3-7). In this embodiment, for example, a 3 bit digital signal consisting of Bit0, Bit1 and Bit2 is input to select the current sources 3 by any of $2^3$ combinations, namely 8 ways.

In FIG. 2, the bias voltage VG is supplied to the bias voltage terminal 4. The bias voltage terminal 4 is connected to each gate of the current source 3 (3-1, 3-2, . . . 3-7). The current sources 3-1, 3-2, 3-7 correspond to the current sources 3-1, 3-2, . . . 3-m in FIG. 1. Each drain of the current sources 3 is connected to one terminal of a switch 8 (8-1, 8-2, . . . 8-7) and each source is grounded. The other end of the switch 8 (8-1, 8-2, . . . 8-7) is connected to an output terminal 6. The digital data Bit0, Bit1, Bit2 are applied to the digital data input terminals 17 (17-1, 17-2, 17-3). The digital data input terminals 17-1, 17-2, and 17-3 are connected to a decoding circuit 16. The decoding circuit 16 decodes the digital data Bit0, Bit1, Bit2 input to the digital data input terminals 17, and outputs signals corresponding to input digital data that actuates the switch 8 (8-1, 8-2, . . . 8-7).

Each current flowing through the current sources 3-1, 3-2, . . . 3-7 of FIG. 2 can be changed by changing the bias voltage VG applied to the bias voltage input terminal 4. The current pulled from the output terminal 6 is determined by the bias voltage VG and the full scale current of the current sources 3-1, 3-2, . . . 3-7. This current is determined based on the necessary transition rate. By selecting the resistance of the output resistor 9 in the variable resistance circuit 10 appropriately, the voltage drop of the output resistor 9 is determined. Therefore, even if the bias voltage VG changes from, for example, VG1 to VG4, it is possible to keep the output voltage at the analog output terminal 5 to V1, just as before.

FIG. 3 illustrates the combinations of the current sources 3 in 8 ways according to a combination of the input digital data Bit0, Bit1, and Bit2. For example, when the input digital data Bit0, Bit1, and Bit2 are 0, 0, 0, all switches 8 are off and the current flowing through the current sources 3 becomes 0. At this time, the current flowing through the output resistor 9 becomes 0. Accordingly, the analog voltage output from the analog output terminal 5 is greatest, in other words, it is equal to the power supply voltage VDD. As a further example, when the input digital data Bit0, Bit1 and Bit2 are 0, 1, 1, the switches 8-1, 8-2, and 8-3 turn on and the current flows through the current sources 3-1, 3-2, and 3-3. Further, for example, when the input digital data Bit0, Bit1 and Bit2 are 1, 1, 1, all switches 8 turn on, and the current flows in all current source 3 (3-1, 3-2, . . . 3-7) and, therefore, the current flowing through the output resistor 9 becomes greatest. At this time, the greatest voltage drop occurs in the output resistors 9 and the analog voltage Vout which is output from the analog output terminal 5 becomes smallest.

Embodiment 3

Figure 4:
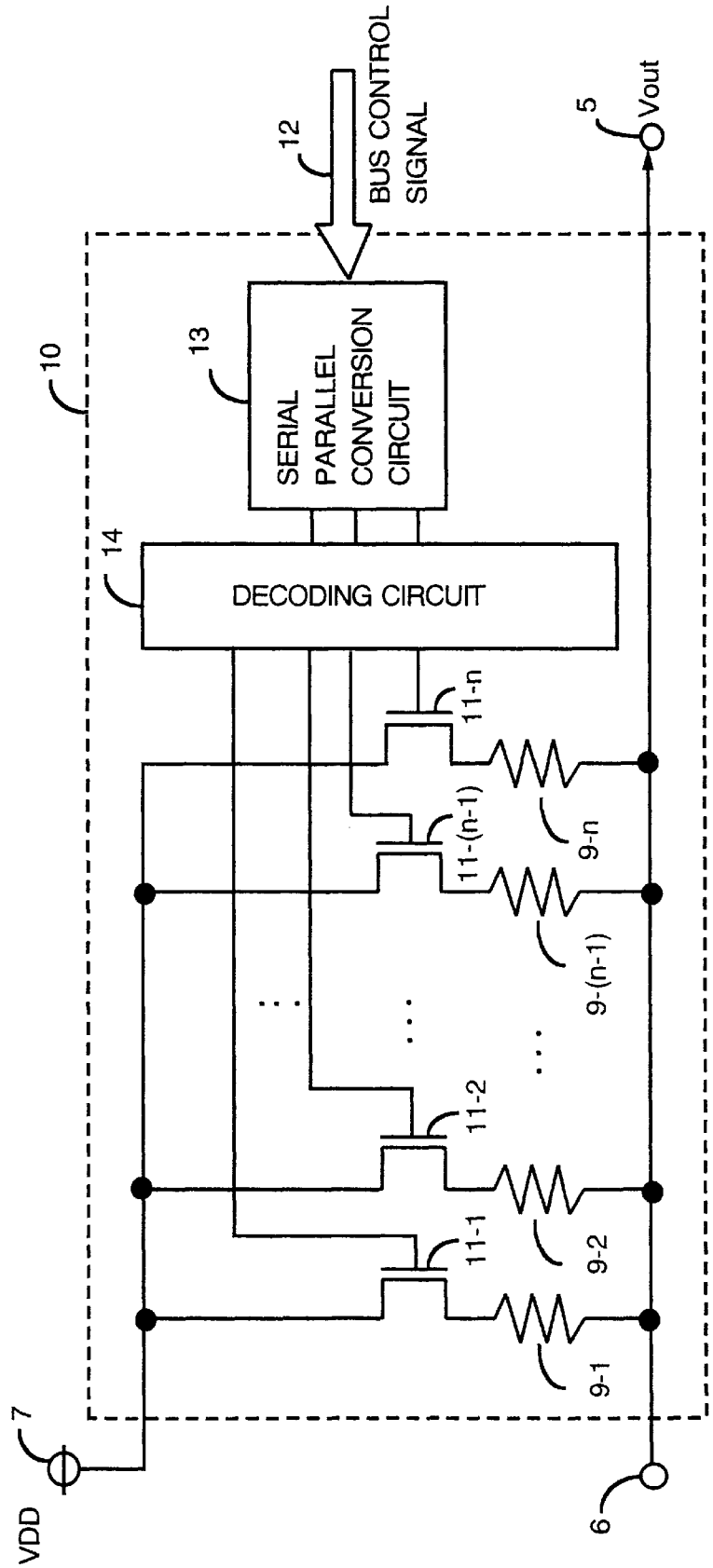
FIG. 4 shows a detailed circuit of a variable resistance circuit of the second embodiment of the present invention.

FIG. 4 shows a detailed circuit of a variable resistance circuit 10 of an embodiment 3 of the present invention. In FIG. 4, a BUS control signal is input to a serial-parallel conversion circuit 13, which is connected to a decoding circuit 14. The output of the decoding circuit 14 is connected to each gate of the switch 11 (11-1, 11-2, . . . 11-n). The drain of each switch (11-1, 11-2, . . . 11-n), constituted of FET, is connected to a voltage source 7 and each source is connected to an output resistance (9-1, 9-2, . . . 9-n). Another end of the output resistance (9-1, 9-2, . . . 9-n) is grounded.

Next, the operation of the variable resistance circuit 10 is explained. A serial BUS control signal 12 sent from a CPU in a personal computer is converted into a parallel signal using the serial-parallel conversion circuit 13. Furthermore, the converted parallel signal is decoded by the decoding circuit 14. The decoded signals is selectively applied to one or more of the transistors 11 (1-1, 11-2, . . . 11-n) of switch 11. According to the decoded signals, the necessary number of the resistors is selected to produce an appropriate output resistance. The current that flows through the source 3 shown in FIG. 1 via the resistors is determined by the variable resistance circuit 10. The output voltage Vout determined by the voltage drop obtained by the current value multiplied by the output resistor 9 is provided at an analog output terminal 5.

What is claimed is:

1. A current output digital-to-analog conversion circuit for converting a digital signal to an analog signal by supplying a current through an output resistor, the circuit comprising:
   a variable resistance circuit having an output resistance varying in response to an external control signal; and
   a current supplying portion for adjusting a current in response to a gate voltage control signal, independent of the external control signal, wherein an output current can be changed while maintaining an output voltage amplitude constant, and the output voltage amplitude can be changed while maintaining the output current constant.

2. The digital-to-analog conversion circuit according to claim 1 wherein said current supplying portion comprises:
   a plurality of current sources connected in parallel, each current source including an MOS transistor having a gate voltage controlled by a gate voltage control signal and a switch having a first end connected to one terminal of the corresponding MOS transistor and a second end connected to an output terminal of the digital-to-analog conversion circuit; and
   a decoding circuit for decoding input digital data to control on/off states of corresponding switches of said current sources, wherein a switch is turned on or off in response to input digital data decoded by said decoding circuit so that a corresponding number of said current sources are connected in parallel, and current flow is controlled by the gate voltages of said MOS transistors.

3. The digital-to-analog conversion circuit according to claim 1 wherein the external control signal is a serial bus control signal and said variable resistance circuit comprises a plurality of series circuits, each series circuit including a resistor and a switch controlled by the serial bus control signal.

4. The digital-to-analog conversion circuit according to claim 3 wherein said variable resistance circuit further comprises:

a serial-parallel conversion circuit for converting the serial bus control signal into a parallel signal; and a decoding circuit for decoding an output signal from said serial-parallel conversion circuit wherein each of said switches includes an MOS transistor having a gate controlled by the signal decoded by said decoding circuit for connecting corresponding resistors of said series circuits in parallel.

5. A digital-to-analog converter comprising:

an input terminal for receiving a digital signal having a digital value;

a current supplying portion producing a current having a magnitude determined by the digital value;

an output terminal at which an analog signal having an analog value corresponding to the digital value is produced; and a variable resistance circuit connected to said current supplying portion and to said output terminal for producing an analog signal in response to a current produced by said current supplying portion, said variable resistance circuit having a resistance determined by a bus control signal, independent of the digital signal, applied to said variable resistance circuit whereby the current can be changed while the analog signal is maintained at a constant amplitude and the amplitude of the analog signal can be changed while the current is maintained constant.

6. The digital-to-analog converter of claim 5 wherein said current supplying portion comprises a plurality of constant current supplies and a plurality of switches, respective pairs of said constant current supplies and of said switches being connected in respective series circuits, said series circuits being connected in parallel, said switches being selectively closed in response to the digital value.

7. The digital-to-analog converter of claim 6 wherein said current supplying portion comprises a decoder, connected to said plurality of switches and receiving the digital signal, for decoding the digital signal and producing switching signals for selectively closing said switches in response to the digital value.

8. The digital-to-analog converter of claim 6 wherein each of said constant current supplies comprises an MOS transistor having a gate for receiving a gate control voltage input to said current supplying portion for controlling current flow in each of said series circuits.

9. The digital-to-analog converter of claim 5 wherein said variable resistance circuit includes a plurality of resistors and a plurality of switches, respective pairs of said resistors and said switches being connected in respective series circuits, said series circuits being connected in parallel, said switches being selectively closed in response to the bus control signal.

10. The digital-to-analog converter of claim 9 wherein said variable resistance circuit includes a serial-parallel conversion circuit for converting the bus control signal from a serial form to a parallel bus control signal and a decoder coupled to said serial-parallel conversion circuit for decoding the parallel bus control signal and producing switching signals for selectively closing said switches.

11. A digital-to-analog converter comprising:

an input terminal for receiving a digital signal having a digital value;

a current supplying portion producing a current having a magnitude determined by the digital value and including a plurality of constant current supplies and a plurality of current switches, respective pairs of said constant current supplies and said current switches being connected in respective series current circuits, said series current circuits being connected in parallel, said current switches being selectively closed in response to the digital value;

an output terminal at which an analog signal having an analog value corresponding to the digital value is produced; and a variable resistance circuit connected to said current supplying portion and to said output terminal for producing an analog signal in response to a current produced by said current supplying portion, said variable resistance circuit having a resistance determined by a bus control signal, independent of the digital signal, applied to said variable resistance circuit, said variable resistance circuit including a plurality of resistors and a plurality of switches, respective pairs of said resistors and said switches being connected in respective series resistance circuits, said series resistance circuits being connected in parallel, said switches being selectively closed in response to the bus control signal.

12. The digital-to-analog converter of claim 11 wherein said current supplying portion comprises a decoder, connected to said plurality of current switches and receiving the digital signal, for decoding the digital signal and producing switching signals for selectively closing said current switches in response to the digital value.

13. The digital-to-analog converter of claim 11 wherein each of said constant current supplies comprises an MOS transistor having a gate for receiving a gate control voltage input to said current supplying portion for controlling current flow in each of said series current circuits.

14. The digital-to-analog converter of claim 11 wherein said variable resistance circuit includes a serial-parallel conversion circuit for converting the bus control signal from a serial form to a parallel bus control signal and a decoder coupled to said serial-parallel conversion circuit for decoding the parallel bus control signal and producing switching signals for selectively closing said switches.

* * * * *